(12) United States Patent
Lee et al.

(10) Patent No.: US 11,539,366 B1
(45) Date of Patent: Dec. 27, 2022

(54) CAPACITIVE TRANSMITTER

(71) Applicants: SK hynix Inc., Icheon (KR); Seoul National University R&DB Foundation, Seoul (KR)

(72) Inventors: Sangyoon Lee, Seoul (KR); Jaekwang Yun, Incheon (KR); Suhwan Kim, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/534,228

(22) Filed: Nov. 23, 2021

(30) Foreign Application Priority Data

Jul. 16, 2021 (KR) .......................... 10-2021-0093218

(51) Int. Cl.
| | |
|---|---|
| *H03K 19/0175* | (2006.01) |
| *H04B 1/04* | (2006.01) |
| *H03K 19/173* | (2006.01) |
| *G05F 1/46* | (2006.01) |
| *H04B 1/16* | (2006.01) |

(52) U.S. Cl.
CPC ....... *H03K 19/017509* (2013.01); *G05F 1/46* (2013.01); *H03K 19/173* (2013.01); *H04B 1/04* (2013.01); *H04B 1/16* (2013.01)

(58) Field of Classification Search
CPC ....... H03K 19/0175; H03K 19/017509; H03K 19/017545; H03K 19/173; H04B 1/04; H04B 1/0483; H04B 1/16; H04B 5/0012; G06F 1/46
See application file for complete search history.

(56) References Cited

U.S. PATENT DOCUMENTS

| | | | |
|---|---|---|---|
| 8,242,811 B2 | 8/2012 | Seo et al. | |
| 9,407,470 B2 | 8/2016 | Agrawal et al. | |
| 2006/0075264 A1 | 4/2006 | Willman et al. | |
| 2011/0248750 A1* | 10/2011 | Seo .................... | G06F 13/4072 327/108 |
| 2012/0007699 A1* | 1/2012 | Ho .......................... | G06F 1/189 333/240 |

FOREIGN PATENT DOCUMENTS

KR        10-0611584 B1      8/2006

OTHER PUBLICATIONS

E. Mensink et al., "Power Efficient Gigabit Communication Over Capacitively Driven RC-Limited On-Chip Interconnects", IEEE Journal of Solid-State Circuits, vol. 45, No. 2, Feb. 2010.
(Continued)

*Primary Examiner* — Long Nguyen

(57) ABSTRACT

A capacitive transmitter includes a control circuit configured to generate a data signal by delaying input data and to generate a control signal according to the input data and a delayed signal thereof; a capacitor connected between a first node and a transmission node; a driving circuit configured to receive the data signal and to provide an output signal corresponding to the data signal to the first node; and a bias setting circuit configured to set a transmission voltage at the transmission node according to the control signal.

10 Claims, 7 Drawing Sheets

(56) References Cited

OTHER PUBLICATIONS

D. Walter et al., "A source-synchronous 90Gb/s capacitively driven serial on-chip link over 6mm in 65nm CMOS," IEEE International Solid-State Circuits Conference, 2012.
B. Dehlaghi et al. "A 0.3 pJ/bit 20 Gb/s/Wire Parallel Interface for Die-to-Die Communication," in IEEE Journal of Solid-State Circuits, vol. 51, No. 11, Nov. 2016.
R. Ho et al., "High Speed and Low Energy Capacitively Driven On-Chip Wires," in IEEE International Solid-State Circuits Conference, 2007.

* cited by examiner

<Prior Art>

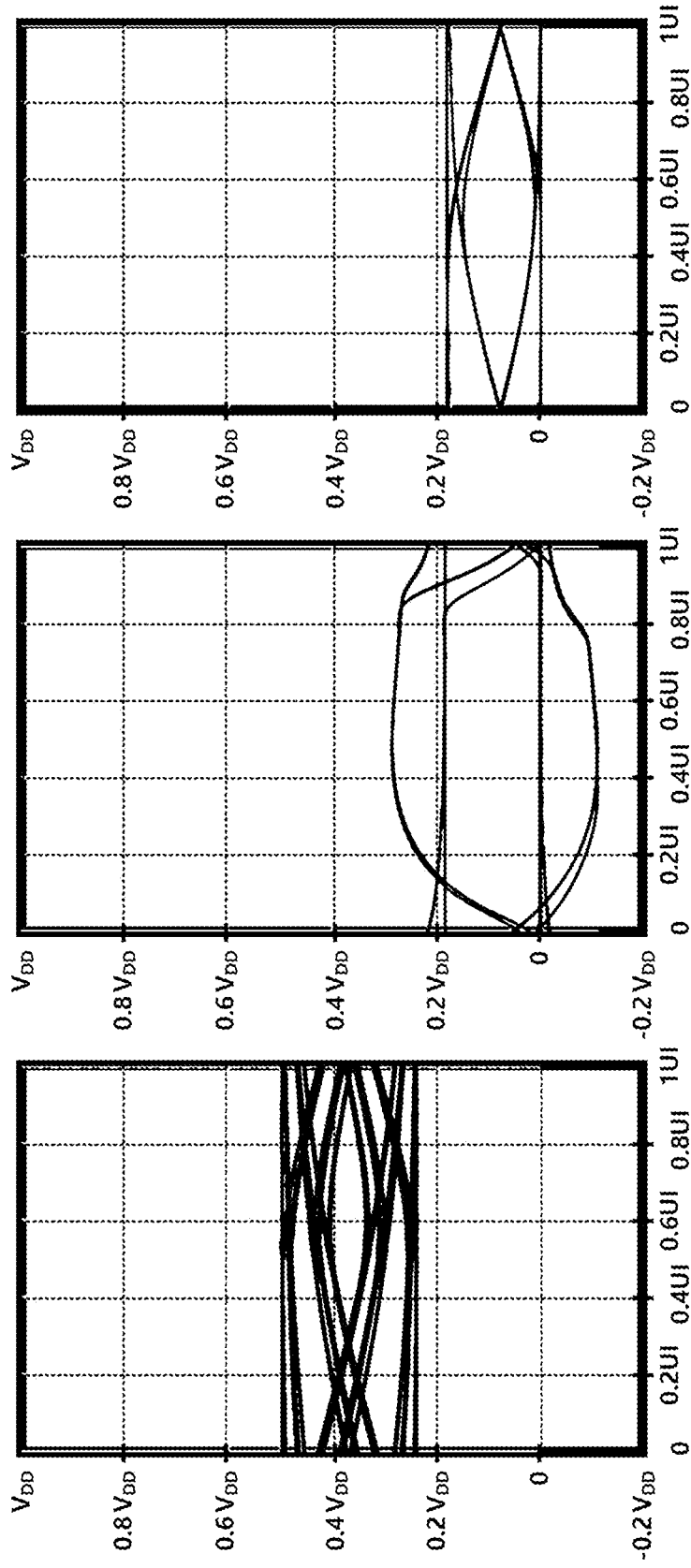

CAPACITIVE TRANSMITTER

CROSS-REFERENCE TO RELATED APPLICATION

The present application claims priority under 35 U.S.C. § 119(a) to Korean Patent Application No. 10-2021-0093218, filed on Jul. 16, 2021, which is incorporated herein by reference in its entirety.

BACKGROUND

1. Technical Field

Various embodiments generally relate to a capacitive transmitter capable of fixing a transmit voltage to a predetermined level according to data.

2. Related Art

As a data transmission rate increases, power consumption also increases. To solve this problem, a capacitive transmitter has been proposed.

FIG. 1 is a circuit diagram showing a conventional capacitive transmitter 1.

The capacitive transmitter 1 includes a driving circuit 10 for driving an output terminal according to input data DI and a capacitor 20 connected to the output terminal of the driving circuit 10.

The transmitter 1 is coupled to a channel 2 via an output node N to provide a transmission voltage VT.

The receiver 3 provides output data DO by comparing a received voltage VOUT output from the channel 2 with a reference voltage VREF.

In the capacitive transmitter 1, since the driving circuit 10 and the channel 2 are AC-coupled through the capacitor 20, there is a problem in accurately transmitting a signal because the transmission voltage VT is not fixed, which lowers the reliability of the output data DO output from the receiver 20.

To this end, a circuit for providing fixed bias voltage to the output node N may be added to the transmitter.

However, such circuits when added in conventional capacitive transmitters have a problem in that power consumption may be increased due to a current path formed between a power supply and a ground, a size of the receiver circuit may be increased too much due to the receiver circuit being based on a differential circuit, the circuit may require a large capacitor, or a combination thereof.

SUMMARY

In accordance with an embodiment of the present disclosure, a capacitive transmitter may include a control circuit configured to generate a data signal by delaying input data and to generate a control signal according to the input data and a delayed signal thereof; a capacitor connected between a first node and a transmission node; a driving circuit configured to receive the data signal and to provide an output signal according to the data signal to the first node; and a bias setting circuit configured to set a transmission voltage at the transmission node according to the control signal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

FIGS. 7A to 7C are eye diagrams showing advantageous effect of a capacitive transmitter according to an embodiment of the present disclosure.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
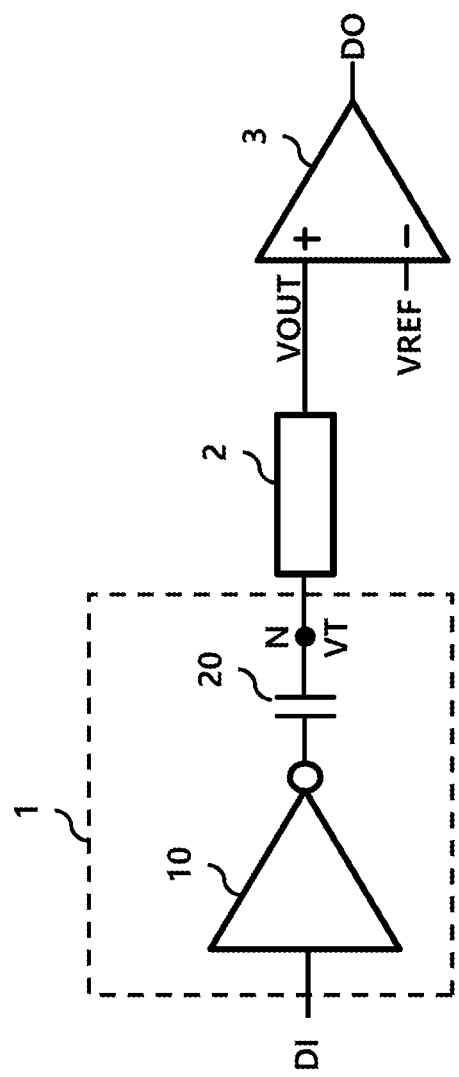
FIG. 1 illustrates a conventional capacitive transmitter.
Figure 2:
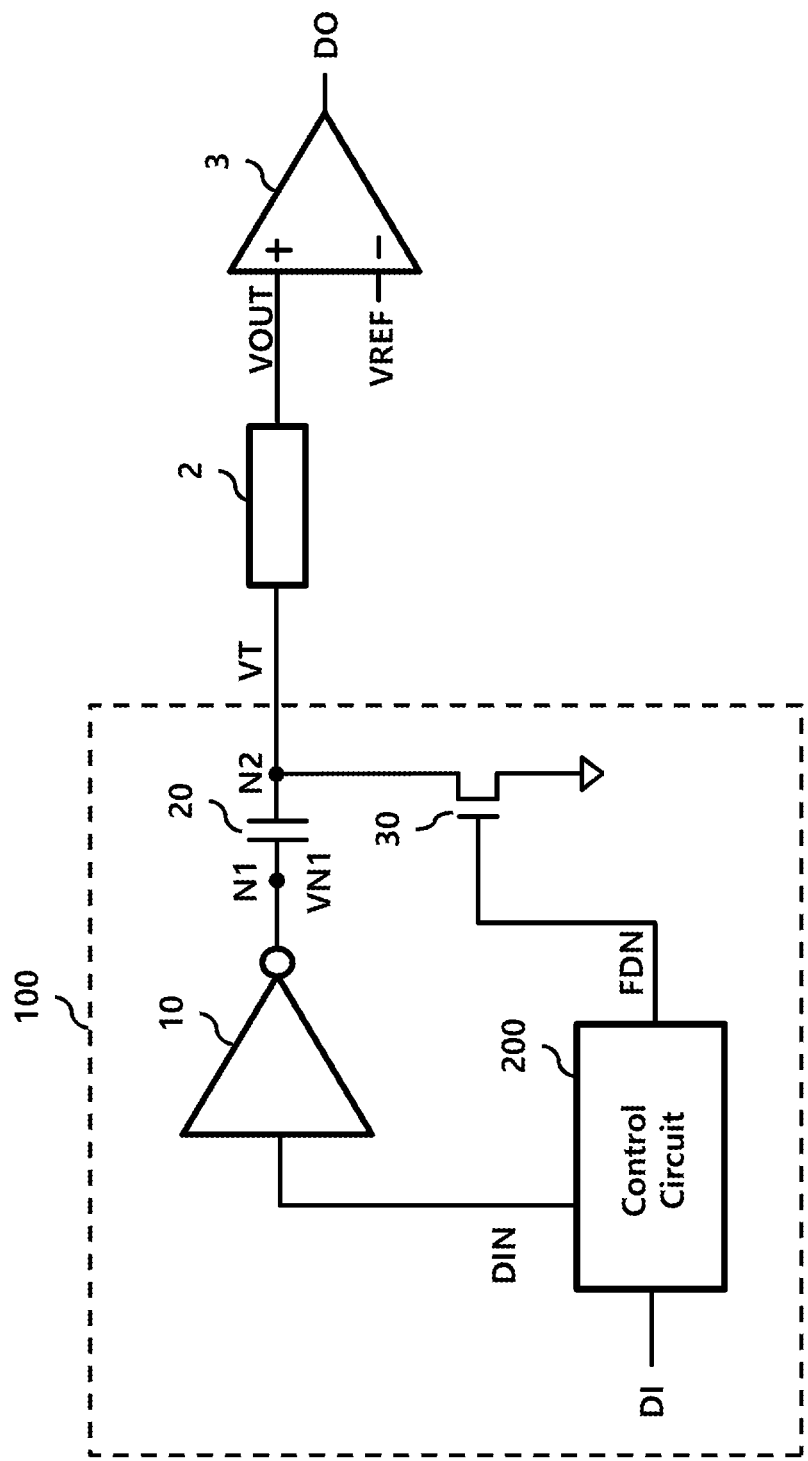
FIG. 2 illustrates a capacitive transmitter according to an embodiment of the present disclosure.

FIG. 2 is a circuit diagram illustrating a capacitive transmitter 100 according to an embodiment of the present disclosure.

The capacitive transmitter 100 includes a driving circuit 10, a capacitor 20, a control circuit 200, and a bias setting circuit 30.

The control circuit 200 generates a data signal DIN and a control signal FDN according to input data DI.

The driving circuit 10 drives its output terminal according to the data signal DIN and the output terminal thereof is connected to the first node N1. Hereinafter, a voltage of the first node N1 is referred to as first node voltage VN1.

The capacitor 20 is connected between the first node N1 and the second node N2. In this case, the second node N2 may be referred to as a transmission node N2, and a voltage of the transmission node N2 may be expressed as a transmission voltage VT.

The bias setting circuit 30 fixes a voltage of the transmission node N2 to a predetermined voltage according to the control signal FDN.

In the present embodiment, the bias setting circuit 30 includes an n-channel Metal-Oxide-Semiconductor (NMOS) transistor having a drain and a source connected between the transmission node N2 and a ground VSS, and a gate to which the control signal FDN is applied.

In the present embodiment, the bias setting circuit 30 fixes the voltage of the transmission node N2 to a ground voltage when the control signal FDN is activated. However, embodiments are not limited thereto.

The channel 2 is connected to the transmission node N2, and the receiver 3 compares a received voltage VOUT output from the channel 2 with a reference voltage VREF to produce the output data DO.

Figure 3:
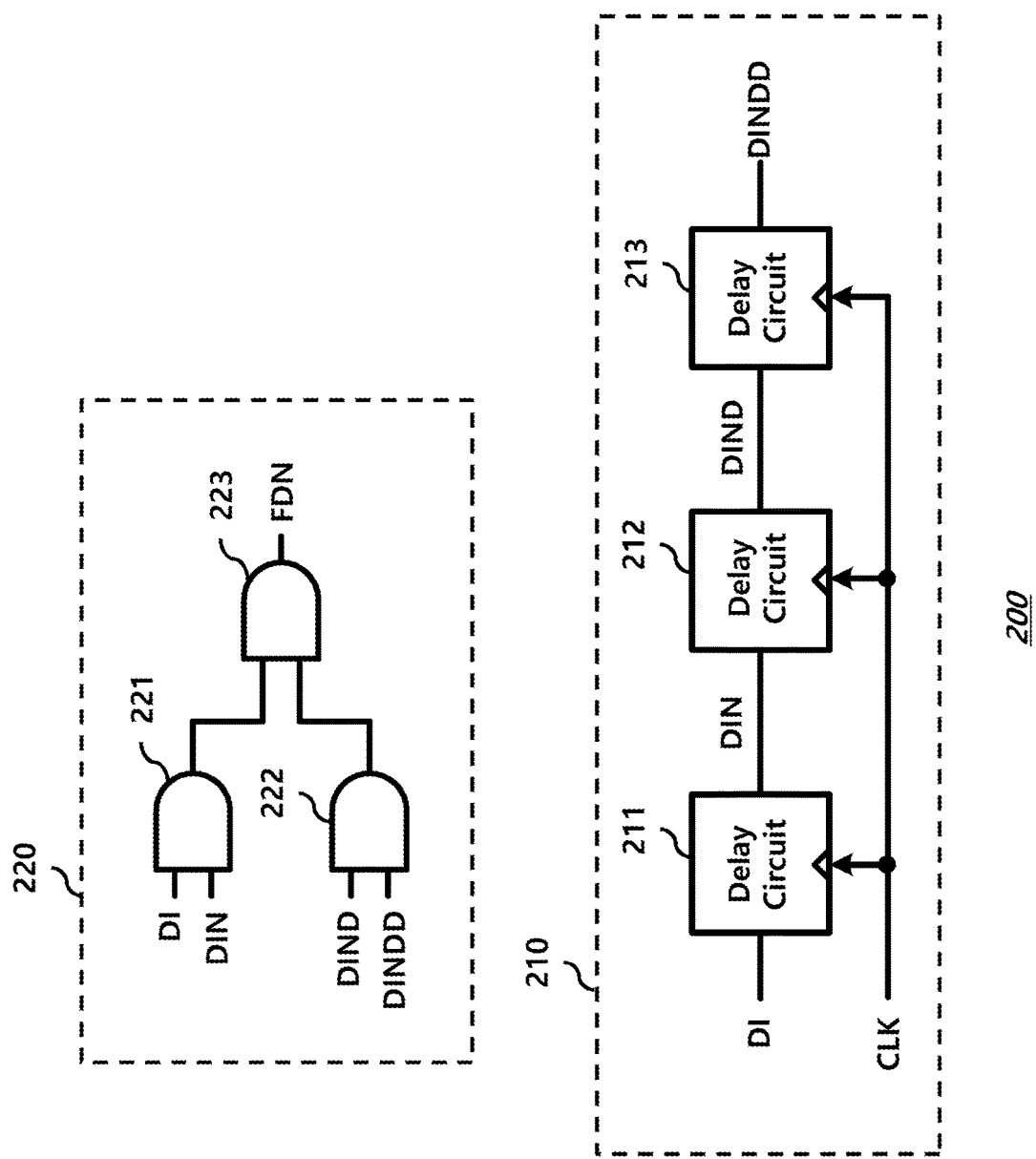
FIG. 3 illustrates a control circuit according to an embodiment of the present disclosure.

FIG. 3 is a block diagram illustrating a control circuit 200 according to an embodiment of the present disclosure.

The control circuit 200 includes a data delay circuit 210 and a control signal generating circuit 220.

The data delay circuit 210 includes a first delay circuit 211, a second delay circuit 212, and a third delay circuit 213 each sequentially delaying the input data DI.

In the present embodiment, the first delay circuit 211, the second delay circuit 212, and the third delay circuit 213 are flip-flops operating according to a clock signal CLK, wherein each delay amount corresponds to a period D (shown in FIG. 4) of the clock signal CLK.

The first delay circuit 211 outputs the data signal DIN by latching the input data DI according to the clock signal CLK, and the input data DI corresponds to a past value of the data signal DIN.

The second delay circuit 212 latches output of the first delay circuit 211 according to the clock signal CLK, and the third delay circuit 213 latches output of the second delay circuit 212 according to the clock signal CLK.

Hereinafter, output of the second delay circuit 212 is expressed as first delay data DIND, and output of the third delay circuit 213 is expressed as second delay data DINDD.

The data signal DIN corresponds to a past value of the first delay data DIND, and the first delay data DIND corresponds to a past value of the second delay data DINDD.

The control signal generating circuit 220 includes first, second, and third AND gates 221, 222, and 223.

The first AND gate 221 performs an AND operation on the input data DI and the data signal DIN.

The second AND gate 222 performs an AND operation on the first delay data DIND and the second delay data DINDD.

The third AND gate 223 outputs the control signal FDN by performing an AND operation on the output of the first AND gate 221 and the output of the second AND gate 222.

Accordingly, the control signal FDN has a high level when all of the input data DI, the data signal DIN, the first delay data DIND, and the second delay data DINDD are at the high level, and has a low level in other cases.

Figure 4:
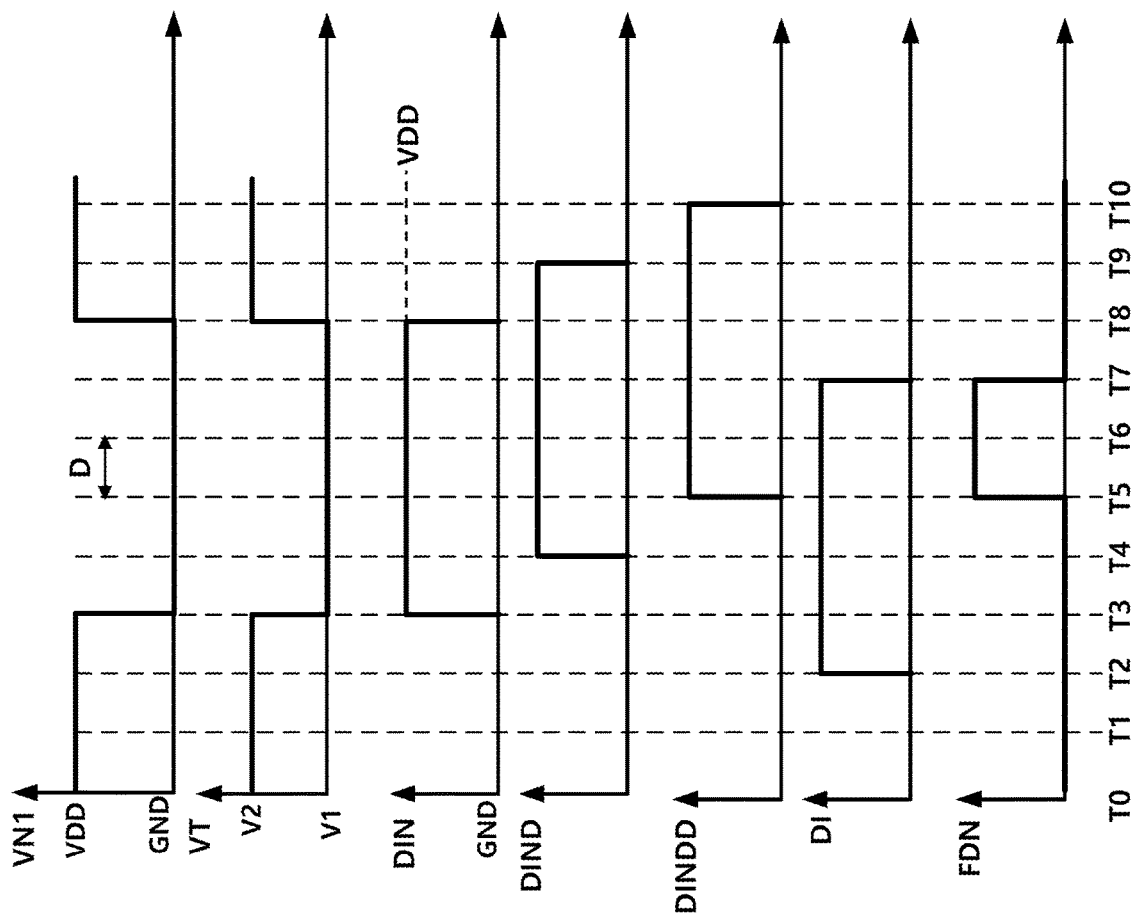
FIG. 4 is a timing diagram illustrating an operation of a capacitive transmitter according to an embodiment of the present disclosure.

FIG. 4 is a timing diagram illustrating an operation of the control circuit 200 according to an embodiment of the present disclosure.

In the drawing, an interval between the dotted lines corresponds to the delay amount D of any one of the first to third delay circuits 211 to 213.

The first node voltage VN1 has the ground voltage GND during the period between T3 to T8 and a power supply voltage VDD in the other periods.

Hereinafter, the power supply voltage VDD may be referred to as a first power supply voltage, and the ground voltage GND may be referred to as a second power supply voltage. The magnitudes of the first and second power supply voltages may be changed according to embodiments.

The transmission voltage VT is AC-coupled to the first node voltage VN1 through the capacitor 20 and therefore follows the first node voltage VN1.

Accordingly, the transmission voltage VT has a first voltage V1 during the period between T3 to T8 and has a second voltage V2 in the other periods. The second voltage V2 is higher than the first voltage V1.

If capacitance of the capacitor 20 is C, capacitance of the channel 2 is Cw, and the first power supply voltage is VDD, difference between the first voltage V1 and the second voltage V2 may be expressed as Equation 1.

$$V2 - V1 = VDD \times \frac{C}{C + Cw} \quad \text{[Equation 1]}$$

Conventionally, the first voltage V1 and the second voltage V2 are not fixed to a predetermined level, but in this embodiment, when the data signal DIN corresponds to "1", the transmission voltage VT is fixed to the ground voltage GND.

As shown in FIG. 2, in the present embodiment, the driving circuit 10 is an inverter, and the data signal DIN input to the driving circuit 10 is out of phase with the first node voltage VN1.

Accordingly, the data signal DIN has a power supply voltage VDD corresponding to the low level of the first node voltage VN1 during the period between T3 to T8 and a ground voltage GND corresponding to the high level of the first node voltage VN1 during the other periods shown.

Since the first delay data DIND is a delayed signal of the data signal DIN, the first delay data DIND has the power supply voltage VDD during the period T4 to T9 and the ground voltage GND during the other periods shown.

Since the second delay data DINDD is a delayed signal of the first delay data DIND, the second delay data DINDD has the power supply voltage VDD during the period between T5 and T10 and has the ground voltage GND during the other periods shown.

Since the data signal DIN is a delayed signal of the input data DI, the input data DI has the power supply voltage VDD corresponding to the low level of the first node voltage VN1 during the period between T2 to T7 and has the ground voltage GND corresponding to the high level of the first node voltage VN1 during the other periods shown.

When the input data DI, the data signal DIN, the first delay data DIND, and the second delay data DINDD are all high levels, the control signal generating circuit 220 produces the control signal FDN having the high level.

Accordingly, the control signal FDN has the high level during the period between T5 and T7 that is included in an interval between T3 and T8, so that during the interval from T5 to T7 the bias setting circuit 30 fixes the transmission voltage VT to the first voltage V1, that is, to the ground voltage.

Figure 5:
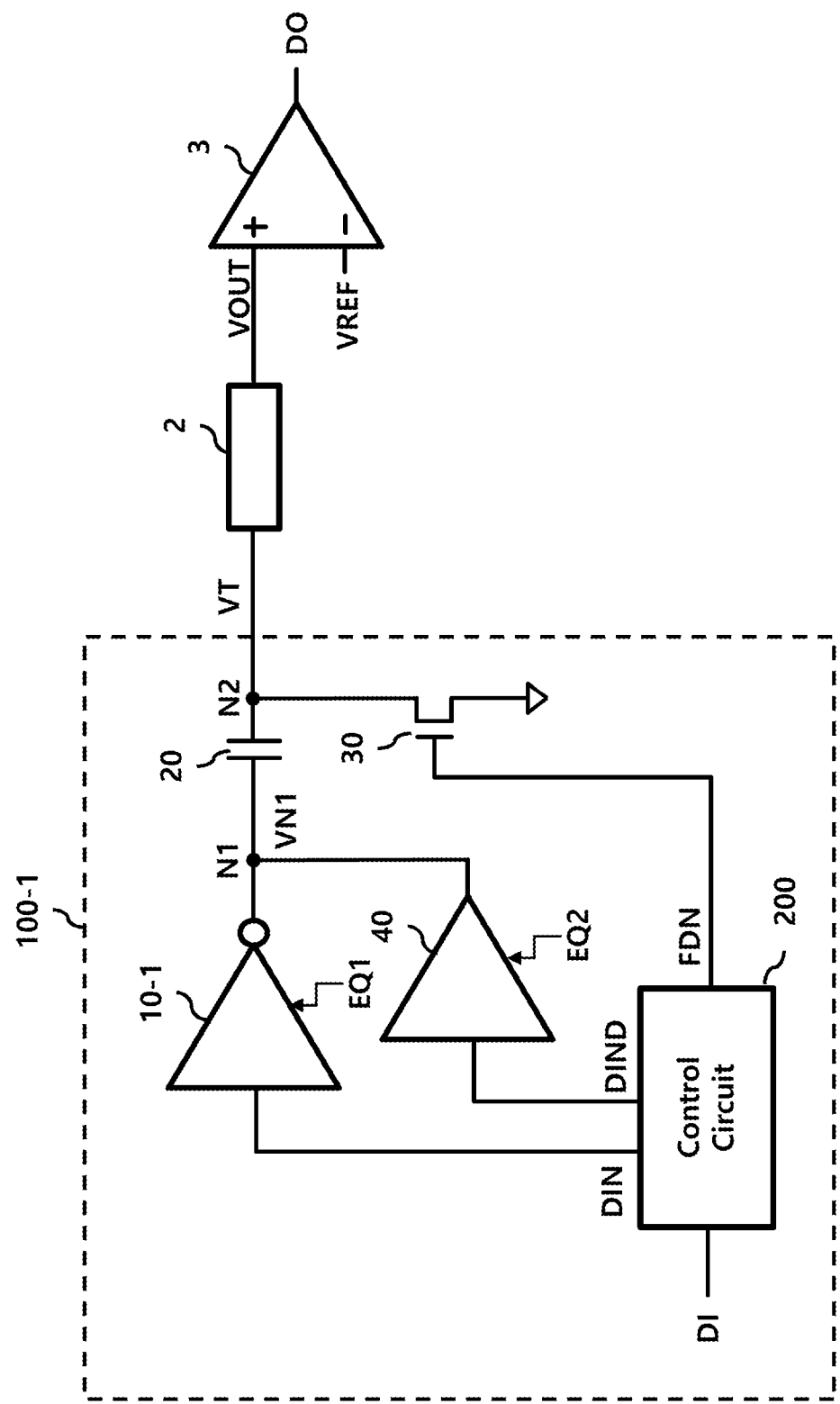
FIG. 5 illustrates a capacitive transmitter according to another embodiment of the present disclosure.

FIG. 5 is a circuit diagram illustrating a capacitive transmitter 100-1 according to another embodiment of the present disclosure.

The capacitive transmitter 100-1 is different from the capacitive transmitter 100 of FIG. 2 in that it further includes an equalization driving circuit 40.

In this embodiment, an output terminal of the equalization driving circuit 40 is connected to the first node N1, not the second node N2. That is, outputs of the driving circuit 10-1 and the equalization driving circuit 40 are commonly connected to the first node N1.

In the present embodiment, the equalization driving circuit 40 is driven by the first delay data DIND.

The driving forces of the driving circuit 10-1 and the equalization driving circuit 40 are adjusted according to the first equalization control signal EQ1 and the second equalization control signal EQ2, respectively.

In the present embodiment, the first node voltage VN1 has a waveform in which the data signal DIN is pre-emphasized by the equalization operation.

Techniques for adjusting the driving force of the driving circuit 10-1 and the equalization driving circuit 40 according to the first and second equalization control signals EQ1 and EQ2, respectively, can be easily derived by a person skilled in the art from the related arts, and thus a detailed description thereof will be omitted. In addition, since the pre-emphasis operation itself is well known, a description thereof will be omitted.

Figure 6:
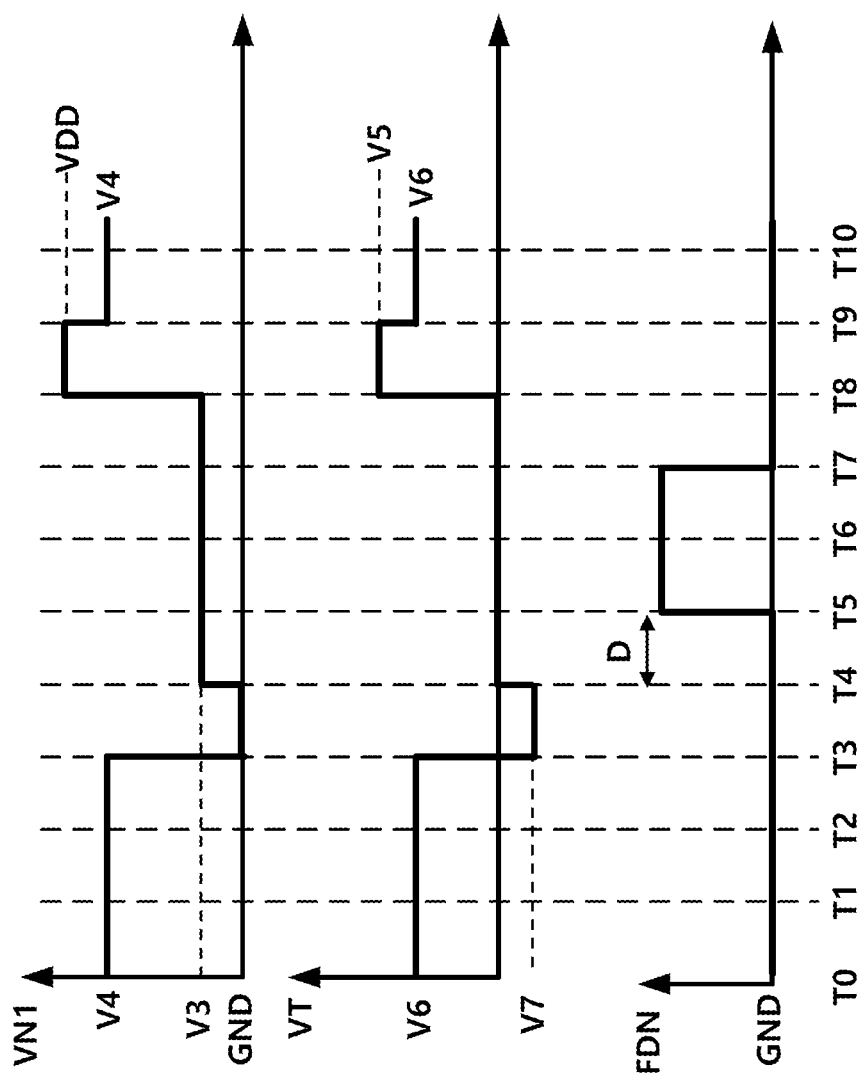
FIG. 6 is a timing diagram illustrating an operation of a capacitive transmitter according to another embodiment of the present disclosure.

FIG. 6 is a timing diagram illustrating an operation of the capacitive transmitter 100-1. Values of the data signal DIN and the first delay data DIND (not shown) for FIG. 6 are the same as shown for the corresponding time periods in FIG. 4.

As described above, the first node voltage VN1 is modified to have an increased amplitude toward a transition direction immediately after the first node voltage VN1 transitions due to the pre-emphasis operation.

Accordingly, the first node voltage VN1 has the ground voltage during the period between T3 and T4 when the data signal DIN has the high level and the first delay data DIND has the low level, the power supply voltage VDD during the period between T8 and T9 when the data signal DIN has the low level and the first delay data DIND has the high level, a third voltage V3 during the period between T4 and T8 when the data signal DIN has the high level and the first delay data DIND has the high level, and a fourth voltage V4 in other times when the data signal DIN has the low level and the first delay data DIND has the low level.

In this case, the third voltage V3 is higher than the ground voltage GND and lower than the fourth voltage V4, and the fourth voltage V4 is higher than the third voltage V3 and lower than the power supply voltage VDD.

As described above, the transmission voltage VT follows the first node voltage VN1.

Since the control signal FDN is activated between T5 and T7, the transmission voltage VT is fixed to the ground voltage GND at this time.

Between T8 and T10, the transmission voltage VT follows the first node voltage VN1.

Accordingly, the transmission voltage VT has a ground voltage GND during the period between T7 and T8, a fifth voltage V5 during the period between T8 and T9, and a sixth voltage V6 during the period between T9 and T10.

In the timing diagram of FIG. 6, it is assumed that the transmission voltage VT has been set to the ground voltage GND in the period in which the control signal FDN is activated before T0.

Accordingly, the transmission voltage VT has a sixth voltage V6 during the period between T0 and T3 like between T9 and T10, a seventh voltage V7 during the period between T3 and T4, and a ground voltage GND during the period between T4 and T5.

In this case, the sixth voltage V6 is higher than the ground voltage GND and lower than the fifth voltage V5, and the seventh voltage V7 is lower than the ground voltage GND.

In addition, a difference between the fifth voltage V5 and the seventh voltage V7 is the same as a difference between the first voltage V1 and the second voltage V2 described in Equation 1.

FIGS. 7A to 7C are eye diagrams showing an advantageous effect of the present embodiment.

FIG. 7A shows an eye diagram of a received voltage VOUT for a capacitive transmitter of the prior art, FIG. 7B shows an eye diagram of a transmission voltage VT of the capacitive transmitter 100-1, and FIG. 7C shows an eye diagram of a received voltage VOUT corresponding to the transmission voltage VT of the capacitive transmitter 100-1.

As shown in FIG. 7A, in the capacitive transmitter of the prior art, since the transmission voltage VT is not fixed according to data, the received voltage VOUT is also not fixed and jitter occurs.

As shown in FIG. 7B and FIG. 7C, in the present embodiment, since the transmission voltage VT and the received voltage VOUT are fixed to the ground voltage when data is 0, jitter hardly occurs.

As shown in FIG. 7B, the transmission voltage VT may have a negative value as a result of the pre-emphasis operation, and it can be seen that the eye characteristic of the received voltage VOUT is improved as shown in FIG. 7C.

Although various embodiments have been illustrated and described, various changes and modifications may be made to the described embodiments without departing from the spirit and scope of the invention as defined by the following claims.

What is claimed is:

1. A capacitive transmitter comprising:
   a control circuit configured to generate a data signal by delaying input data and to generate a control signal according to the input data and a delayed signal thereof;
   a capacitor connected between a first node and a transmission node;
   a driving circuit configured to receive the data signal and to provide an output signal according to the data signal to the first node; and
   a bias setting circuit configured to set a transmission voltage at the transmission node according to the control signal.

2. The capacitive transmitter of claim 1, wherein the control signal is activated during a time interval included in an interval where the data signals is at a low level, and the bias setting circuit sets the transmission voltage to a second power supply voltage lower than a first power supply voltage in the time interval.

3. The capacitive transmitter of claim 2, wherein the control circuit includes:
   a data delay circuit configured to generate a plurality of delay signals by delaying the input data; and
   a control signal generating circuit configured to generate the control signal according to the input data and the plurality of delay signals.

4. The capacitive transmitter of claim 3, wherein the data delay circuit includes:
   a first delay circuit configured to generate the data signal by delaying the input data;
   a second delay circuit configured to generate first delay data by delaying the data signal; and
   a third delay circuit configured to generate second delay data by delaying the first delay data.

5. The capacitive transmitter of claim 4, wherein each of the first delay circuit, the second delay circuit, and the third delay circuit comprises a flip-flop latching an input signal according to a clock signal.

6. The capacitive transmitter of claim 4, wherein the control signal generating circuit includes one or more logic gates, and generates the control signal according to a logic operation performed by the one or more logic gates on the input data, the data signal, the first delay data, and the second delay data.

7. The capacitive transmitter of claim 1, further comprising an equalization driving circuit configured to:
   receive a delayed signal of the data signal; and
   drive the first node according to the received delayed signal.

8. The capacitive transmitter of claim 7, wherein the equalization driving circuit receives first delay data which corresponds to the delayed signal of the data signal.

9. The capacitive transmitter of claim 8, wherein the equalization driving circuit operates with the driving circuit to provide pre-emphasis to the output signal provided to the first node.

10. The capacitive transmitter of claim 7, wherein the driving circuit is controlled by a first equalization control signal and the equalization driving circuit is controlled by a second equalization control signal.

* * * * *